(12) United States Patent
Lee et al.

(10) Patent No.: US 7,864,516 B2
(45) Date of Patent: Jan. 4, 2011

(54) DISPLAY UNIT AND MULTI-DISPLAY DEVICE HAVING THE SAME

(75) Inventors: Young-Jae Lee, Yongin-si (KR); Nam-Sik Ko, Asan-si (KR); Jin-Ho Park, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 120 days.

(21) Appl. No.: 12/394,463

(22) Filed: Feb. 27, 2009

(65) Prior Publication Data
US 2009/0225506 A1 Sep. 10, 2009

(30) Foreign Application Priority Data
Mar. 7, 2008 (KR) .................. 10-2008-0021627

(51) Int. Cl.
G06F 1/16 (2006.01)
(52) U.S. Cl. ................ 361/679.21; 345/1.3; 348/836; 710/104; 711/113

(58) Field of Classification Search ............ 345/1.3, 345/1.1, 536, 531, 32, 168; 348/836, 383, 348/231.4, 231.2; 40/448; 361/679.21, 679.27, 361/679.29, 679.31, 679.33, 679.34, 679.37, 361/679.49; 710/313, 104, 38; 438/118, 438/210, 245; 711/126, 111, 162, 103, 113
See application file for complete search history.

(56) References Cited

U.S. PATENT DOCUMENTS

| | | | |
|---|---|---|---|
| 6,314,669 B1 * | 11/2001 | Tucker | 40/448 |
| 7,046,310 B2 * | 5/2006 | Lee | 348/836 |
| 2008/0266206 A1 * | 10/2008 | Nelson et al. | 345/1.3 |

FOREIGN PATENT DOCUMENTS

| | | |
|---|---|---|
| JP | 2001100666 | 4/2001 |
| JP | 2002055354 | 2/2002 |
| JP | 2005331834 | 12/2005 |

* cited by examiner

Primary Examiner—Hung V Duong
(74) Attorney, Agent, or Firm—Cantor Colburn LLP

(57) ABSTRACT

A display unit includes; a display panel, and a receptacle including of a plurality of sidewalls configured to receive the display panel, the receptacle including at least one joining projection disposed on at least one of the sidewalls, at least one joining groove formed on at least one of the sidewalls, wherein the at least one joining projection and the at least one groove are disposed on opposing sidewalls of the receptacle in substantially symmetrical positions with respect to a center line of the receptacle.

26 Claims, 17 Drawing Sheets

DISPLAY UNIT AND MULTI-DISPLAY DEVICE HAVING THE SAME

This application claims priority to Korean Patent application No. 10-2008-0021627, filed on Mar. 7, 2008, and all the benefits accruing therefrom under 35 U.S.C. §119, the contents of which in its entirety are herein incorporated by reference.

BACKGROUND OF THE INVENTION

1. Field of the Invention

The present invention relates to a display unit and a multi-display device including the same, and more particularly to a display unit which can be easily joined to constitute a multi-display device having a substantially uniform flatness, and a multi-display device including the same.

2. Description of the Prior Art

With the development of modern society as an information society, large-sized and thin display devices have been demanded in the market. Since conventional cathode ray tube ("CRT") devices cannot fully satisfy such demand, calls for flat display devices such as plasma display panels ("PDPs"), plasma address liquid crystal display panels ("PALC display panels"), liquid crystal displays ("LCDs"), organic light emitting diode displays ("OLED displays"), and other similar displays, are explosively increasing.

An LCD is a display device having various advantages over CRT devices, such as low power consumption, small size, and the like, and has been widely used in the fields of computer industry, electronic industry, information & communications industry, and the like. A typical LCD includes a liquid crystal panel assembly provided with a liquid crystal panel for displaying image information, a backlight assembly provided with a light emitting device and a light guide plate guiding emitted light toward the liquid crystal panel, and a receptacle receiving the liquid crystal panel assembly and the backlight assembly.

Recently, with the demand for a large-screen liquid crystal display, there has been an increasing interest in a multi liquid crystal display having a plurality of liquid crystal display units joined together.

In order to keep the flatness of a display screen of a multi-display device, it is required to make respective display units accurately coincide with one another. Accordingly, there is a need for a structure in which display units can be easily joined together with their display screens accurately coinciding with one another.

Also, in order to increase the display region of a multi-display device, it is required to maximize front display regions of display units constituting the multi-display device while reducing the area of the joined display which does not display information, e.g., a bezel region around the individual displays. Accordingly, there is a need for a structure which can simplify a joined structure of the display units and minimize the bezel region of a receptacle.

BRIEF SUMMARY OF THE INVENTION

Accordingly, an aspect of the present invention is to provide a display unit which can be easily joined to constitute a multi-display device maintaining a uniform flatness. Another aspect of the present invention is to provide a multi-display device including display units which can be easily joined to constitute the multi-display device maintaining a uniform flatness. Additional advantages, objects, and features of the invention will be set forth in part in the description which follows and in part will become apparent to those having ordinary skill in the art upon examination of the following or may be learned from practice of the invention.

An exemplary embodiment of a display unit according to the present invention includes; a display panel, and a receptacle including a plurality of sidewalls configured to receive the display panel, the receptacle including at least one joining projection disposed on at least one of the sidewalls, at least one joining groove formed on at least one of the sidewalls, wherein the at least one joining projection and the at least one joining groove are disposed on opposing sidewalls of the receptacle in substantially symmetrical positions with respect to a center line of the receptacle.

In another exemplary embodiment of the present invention, an exemplary embodiment of a multi-display device includes; a plurality of display units each having a receptacle including a plurality of sidewalls configured to receive an individual display panel of the plurality of display panels, each of the plurality of receptacles including at least one joining groove formed on at least one of the side walls, wherein the at least one joining projection and the at least one joining groove are disposed on opposing sidewalls of the receptacle in substantially symmetrical positions with respect to a center line of the receptacle.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE INVENTION

Figure 1A:
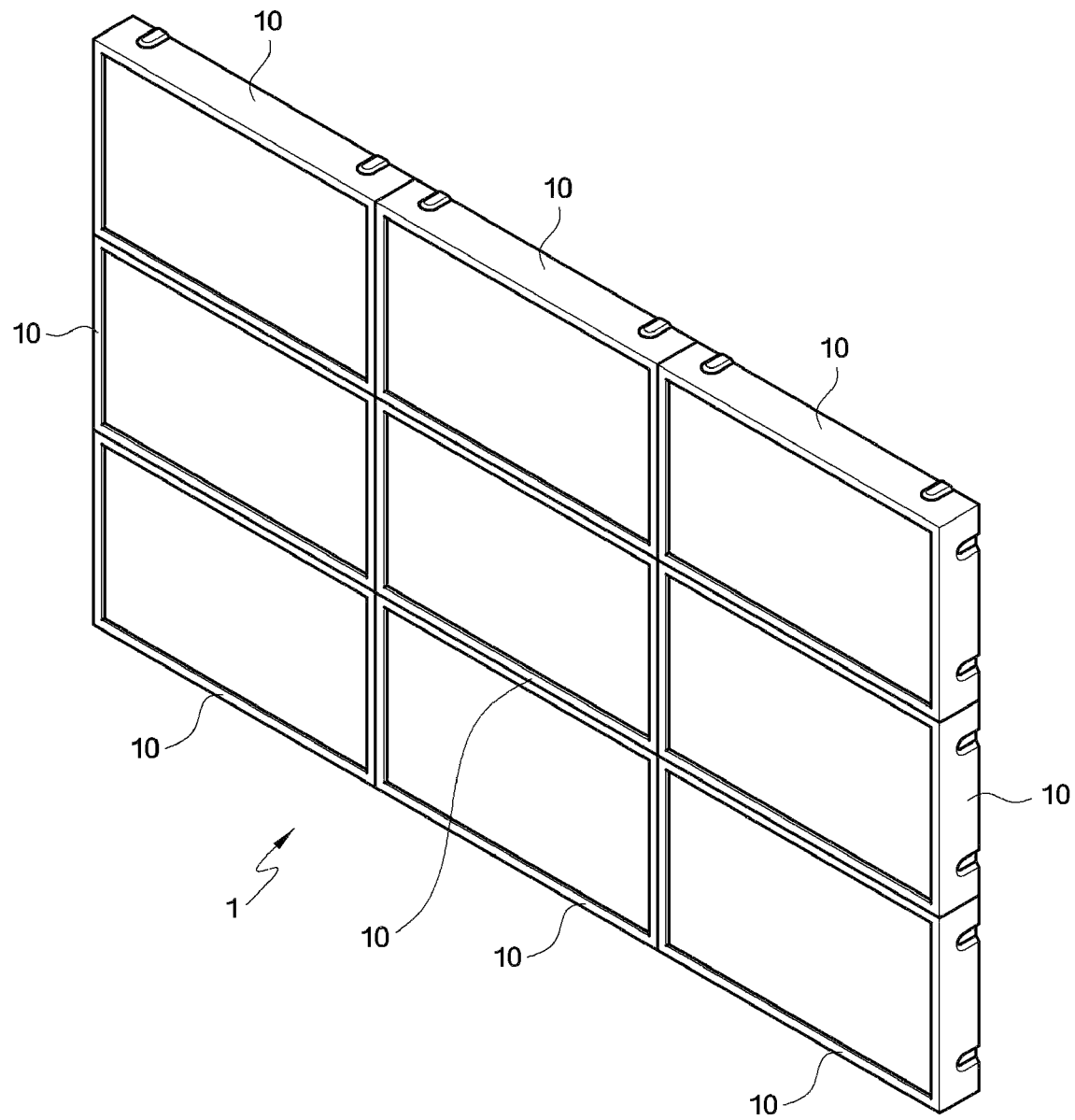
FIG. 1A is a front perspective view of a first exemplary embodiment of a multi-display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 1B:
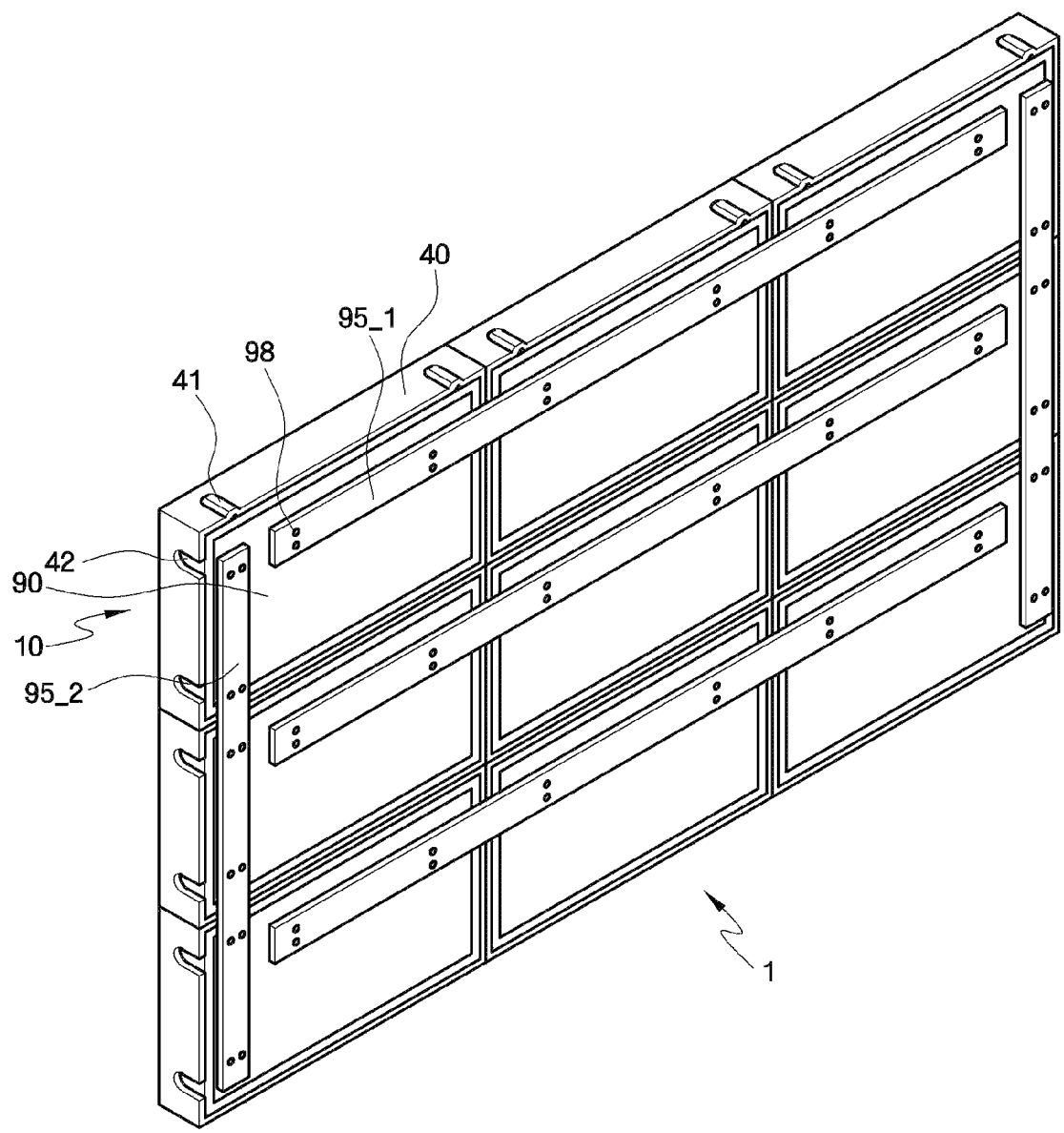
FIG. 1B is a rear perspective view of the first exemplary embodiment of a multi-display device of FIG. 1A.
Figure 2A:
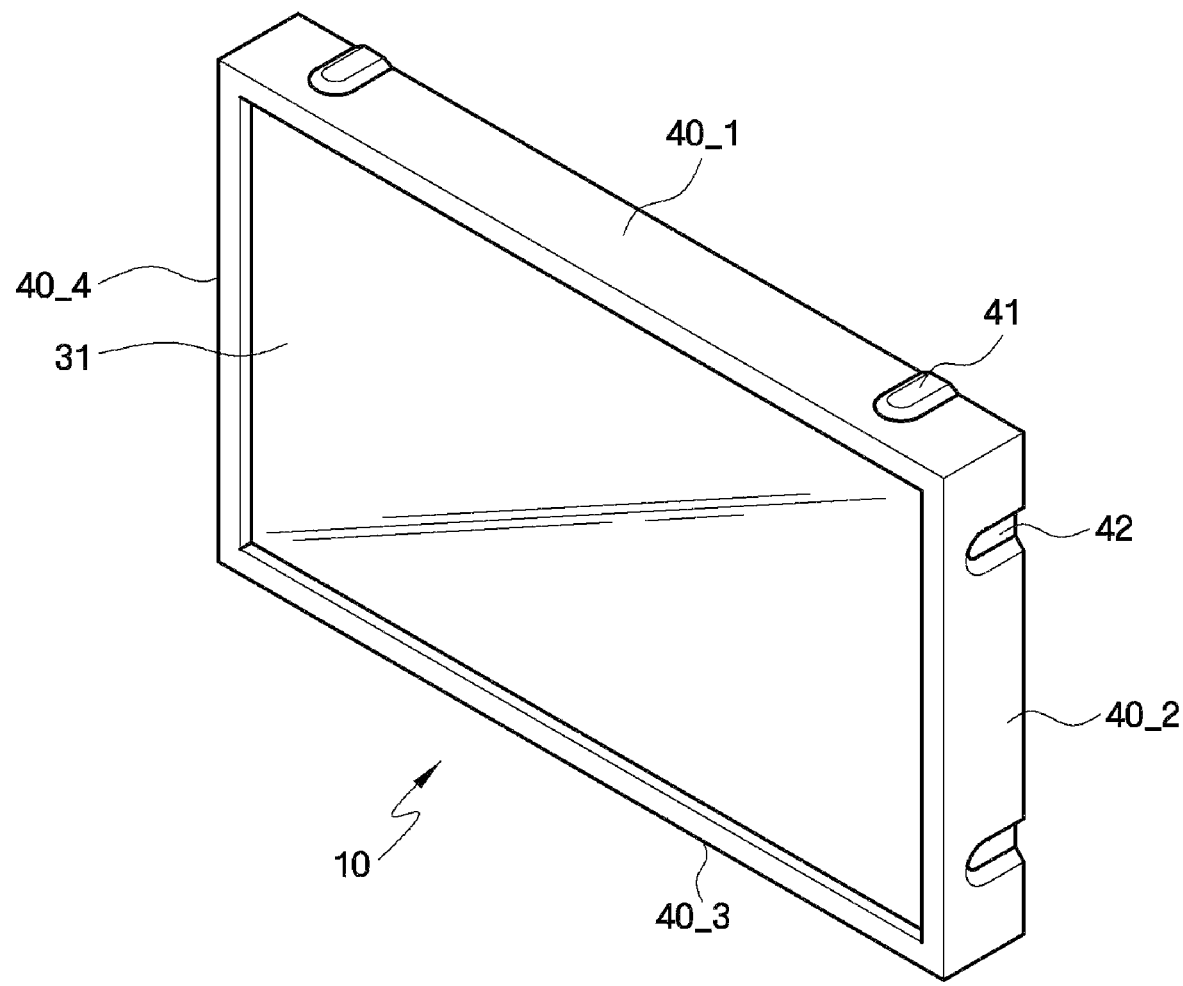
FIG. 2A is a front perspective view of an exemplary embodiment of a display unit included in the first exemplary embodiment of a multi-display device of FIG. 1A.

Hereinafter, a first exemplary embodiment of a multi-display device according to the present invention will be described in detail with reference to FIGS. 1A, 1B and 2A. Here, FIG. 1A is a front perspective view of a first exemplary embodiment of a multi-display device according to the present invention, FIG. 1B is a rear perspective view of the first exemplary embodiment of a multi-display device of FIG. 1A, and FIG. 2A is a front perspective view of an exemplary embodiment of a display unit included in the first exemplary embodiment of a multi-display device of FIG. 1A.

The first exemplary embodiment of a multi-display device 1 according to the present invention includes a plurality of display units 10 joined together to form a large-area display screen. The multi-display device 1 may be provided with a controller (not illustrated) that controls the respective display units 10 to form one large-area screen. The respective display units 10 are arranged so that their display panels 31 are co-planarly oriented in one direction to form the multi-display device 1 having a single plane.

The screen ratio of the multi-display device 1 can be adjusted in accordance with the number of display units 10 joined together and their arrangement method. That is, by adjusting the number of display units 10 in a horizontal direction and the number of display units 10 in a vertical direction, which are arranged in the multi-display device 1, the screen ratio of the display units can be configured as desired. For example, if the display units 10 are arranged by 2×2 in horizontal and vertical directions, a screen having the same screen ratio as the display unit 10 can be maintained, and an image being display on the screen may be enlarged by a factor of two. Also, by arranging the display units 10 by 3×3 in horizontal and vertical directions, the image being displayed on the screen may be enlarged by a factor of three while maintaining the same screen ratio. As described above, the size of the image being displayed can be adjusted in accordance with the number of the display units 10 joined to in the multi-display device 1. However, the screen ratio and the arrangement method of the display units 10 may not be limited to those described above. The screen ratio of the multi-display device 1 can be adjusted in consideration of the use purpose and installation place of the multi-display device 1.

On the other hand, it is not required to uniformly control the multi-display device 1 in order to provide one display screen. That is, in an alternative exemplary embodiment, a first image may be displayed through some display units 10 and a second image may be displayed through the remaining display units 10.

In the multi-display device 1, the respective display units 10 are arranged to form a flat surface, and are joined together through guide bars 95_1 and 95_2. In one exemplary embodiment, the guide bars 95_1 and 95_2 are installed on the rear surfaces of the display units 10. Although the display units 10 can be joined together through the guide bars 95_1 and 95_2, it is also possible to fix them through separate fixing members 98 in order to obtain a stronger joining force, as will be discussed in more detail below.

In one exemplary embodiment, joining projections 41 are disposing on an outer surface of an upper receptacle 40 of a respective display unit 10. The joining projections 41 may be joined to joining grooves 42. The joining projections 41 are joined to the joining grooves 42 so that the display units 10 are joined together to form one multi-display device 1. In an alternative exemplary embodiment, the joining projections 41 and the joining grooves 42 may also be formed on a lower receptacle 90 instead of the upper receptacle 40. Details of the display units 10, the joining projections 41, and the joining grooves 42 will be described in more detail later.

Figure 2B:
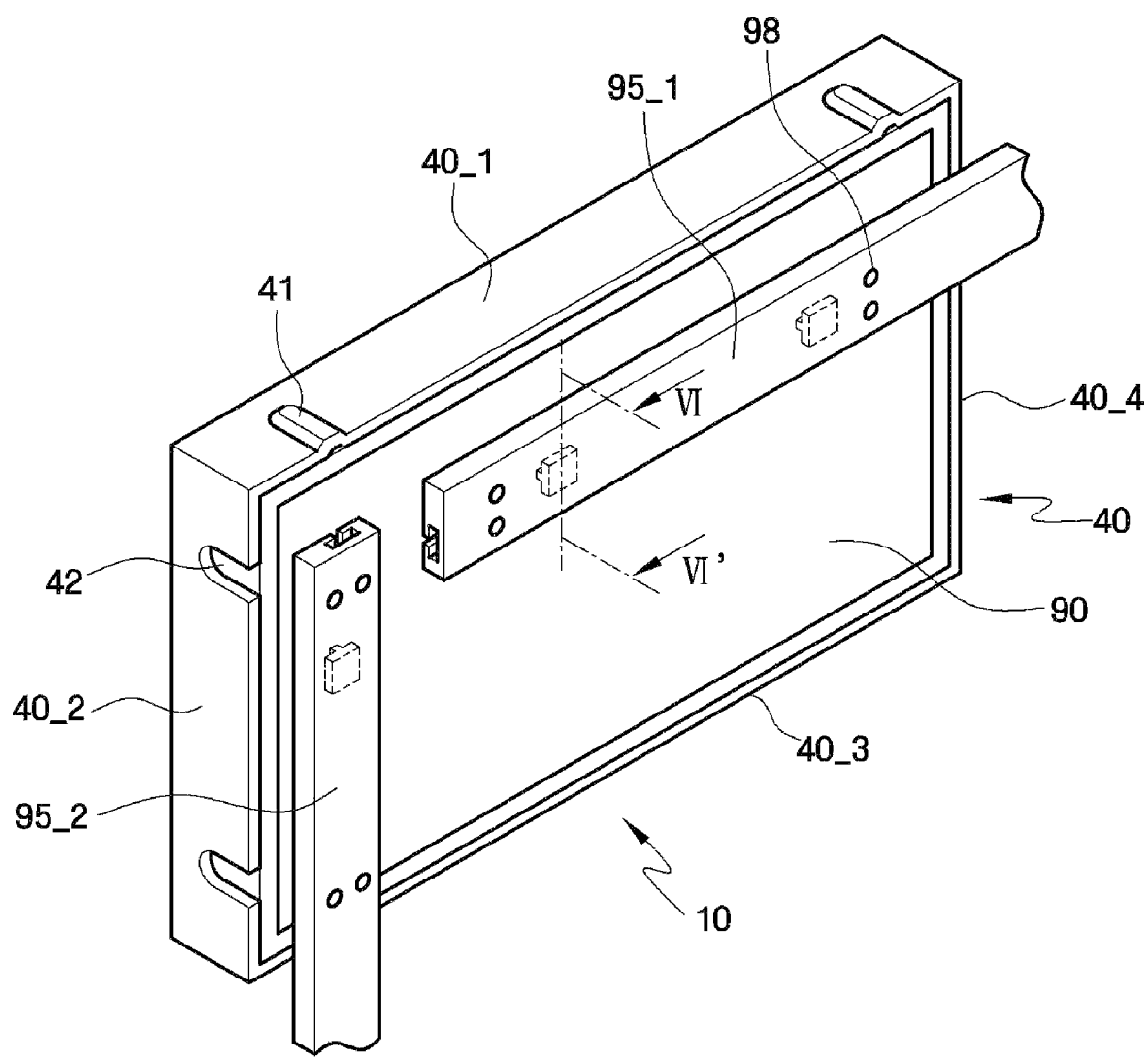
FIG. 2B is a rear perspective view of the exemplary embodiment of a display unit of FIG. 2A.
Figure 3:
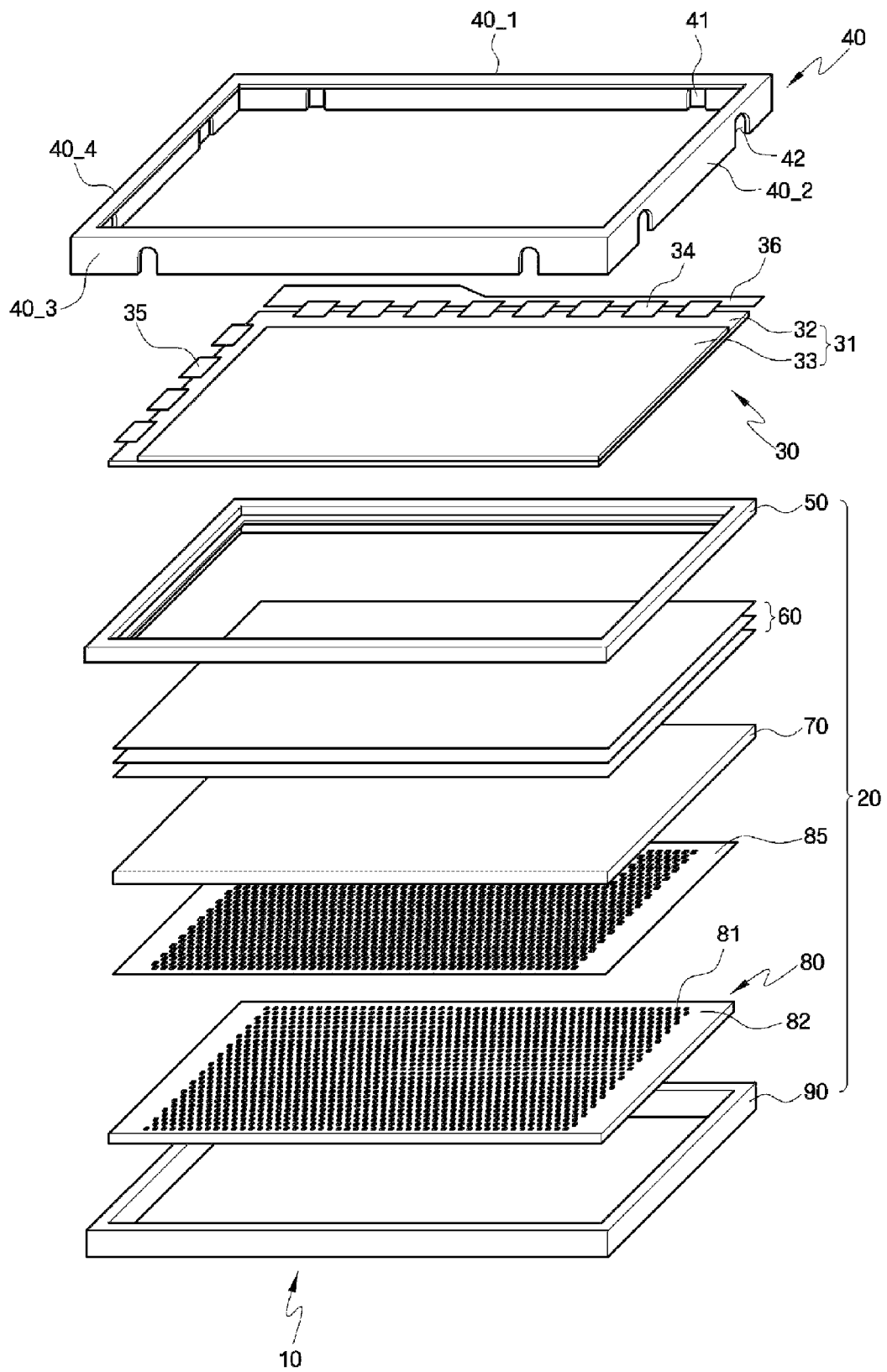
FIG. 3 is an exploded perspective view of the exemplary embodiment of a display unit of FIG. 2A.
Figure 4:
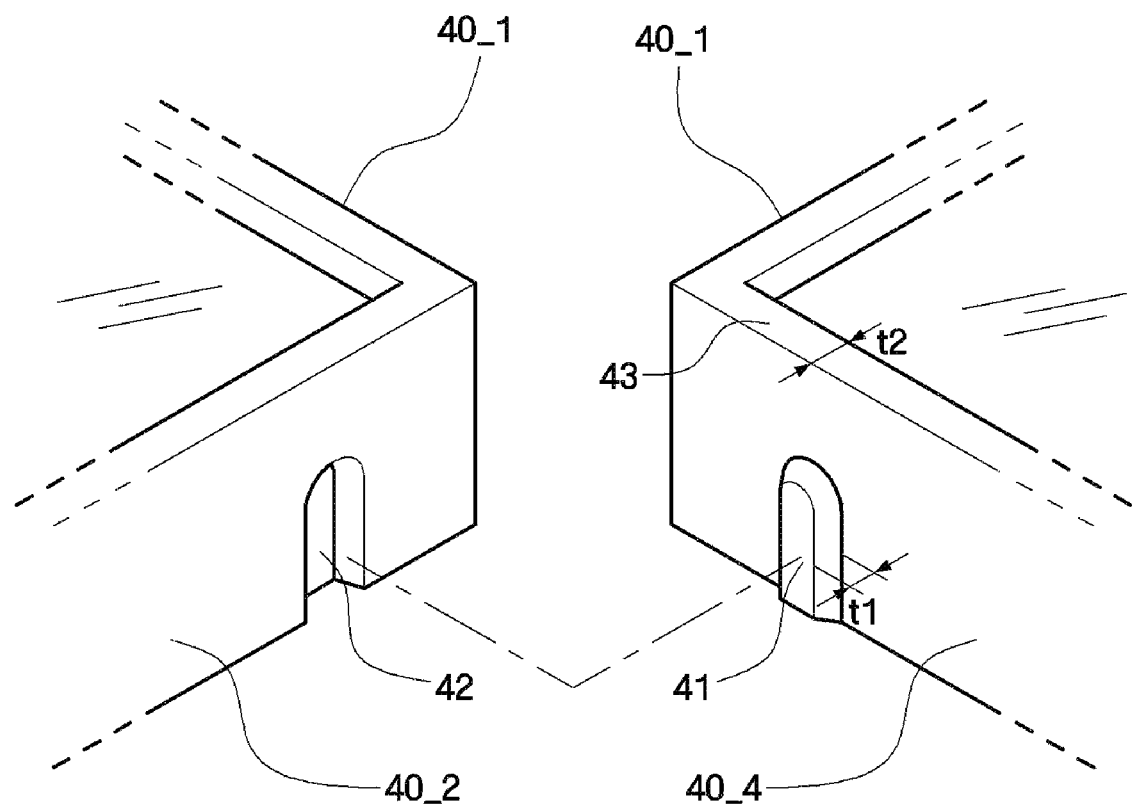
FIG. 4 is a partial side perspective view illustrating joining of exemplary embodiments of a display unit to form the first exemplary embodiment of a multi-display device of FIG. 1A.
Figure 5:
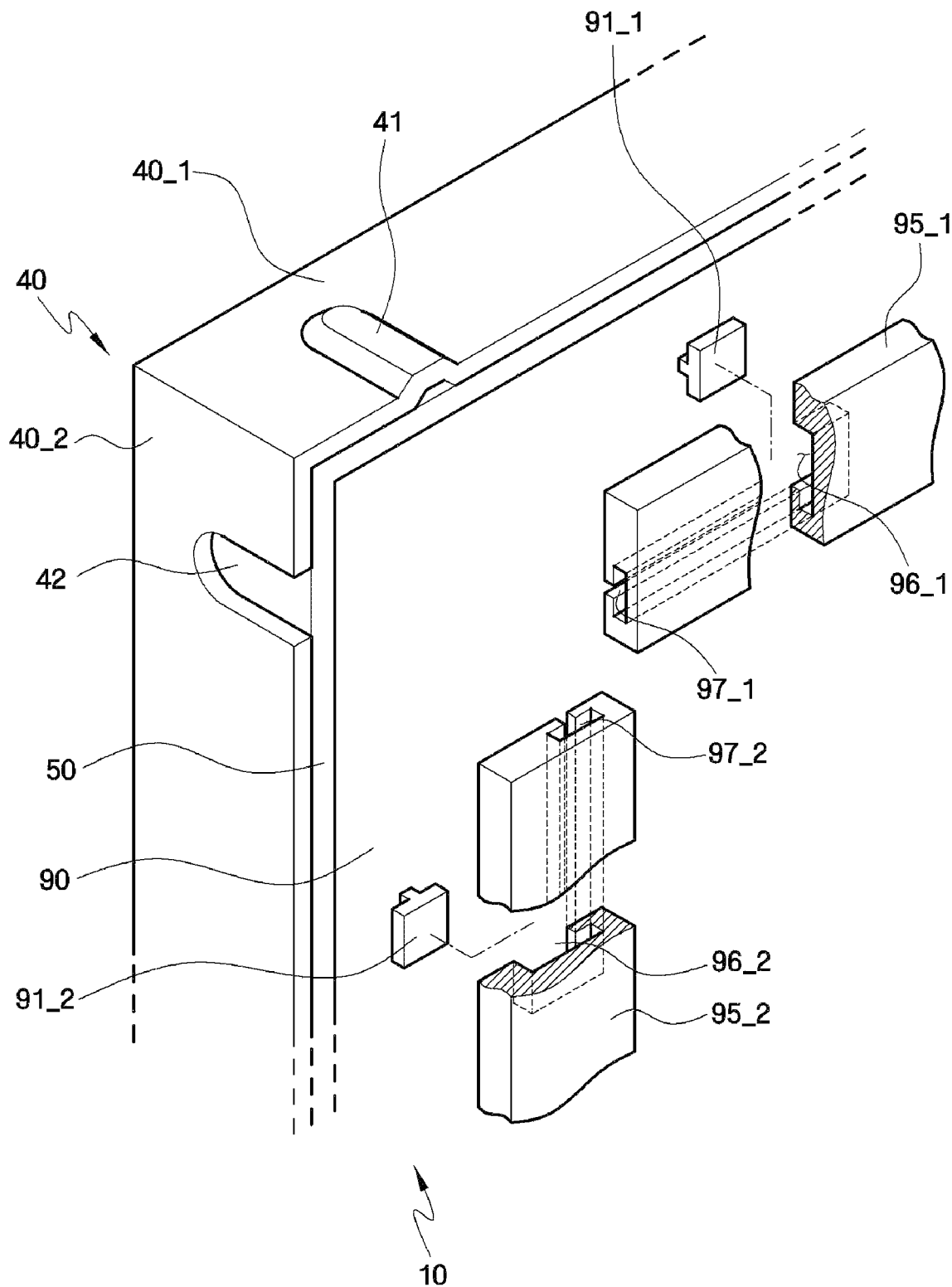
FIG. 5 is a partial rear perspective view of the exemplary embodiment of a display unit of FIG. 2B.
Figure 6:
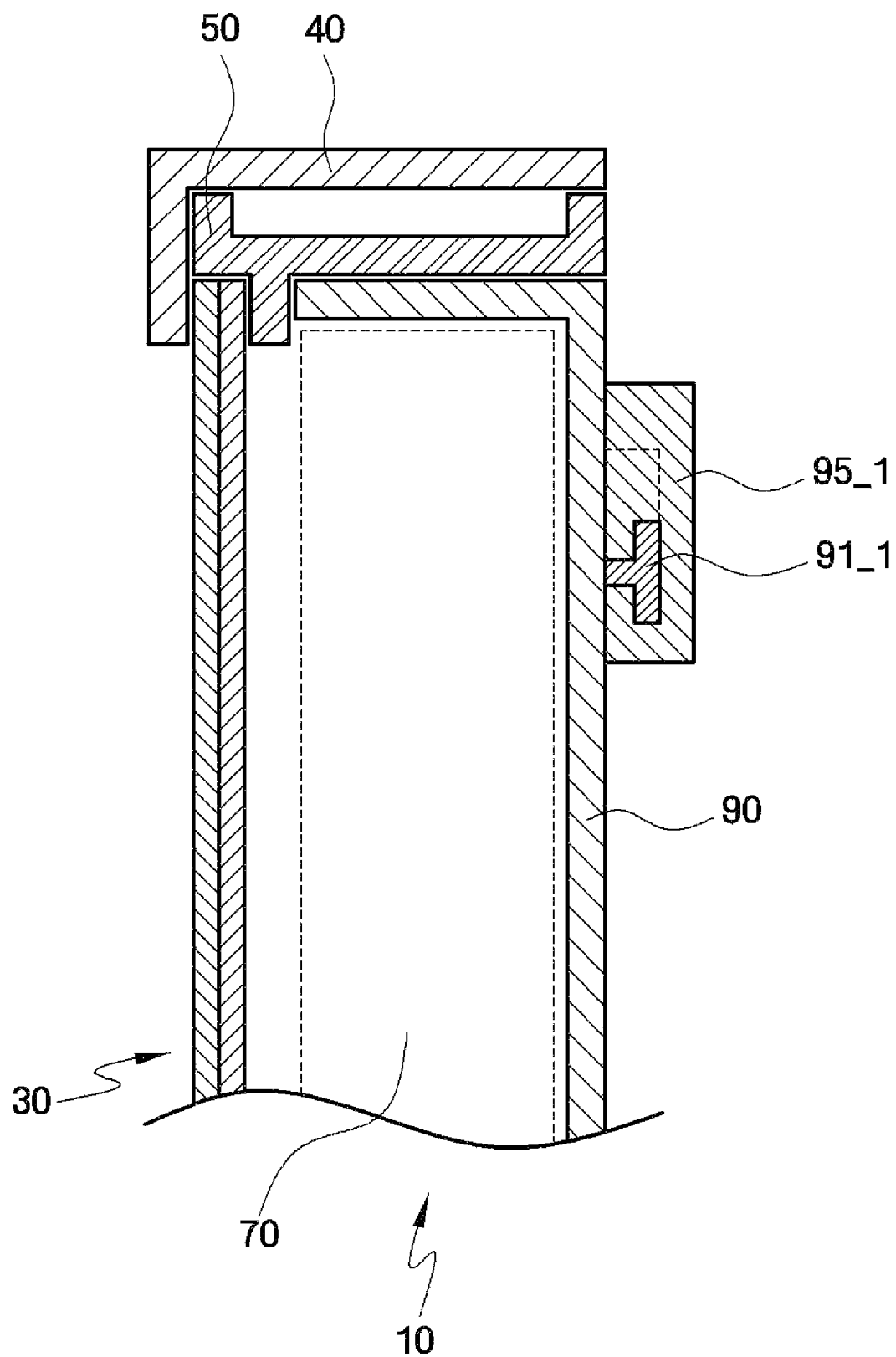
FIG. 6 is a cross-sectional view of the exemplary embodiment of a display unit of FIG. 2B, taken along line VI-VI'.
Figure 7:
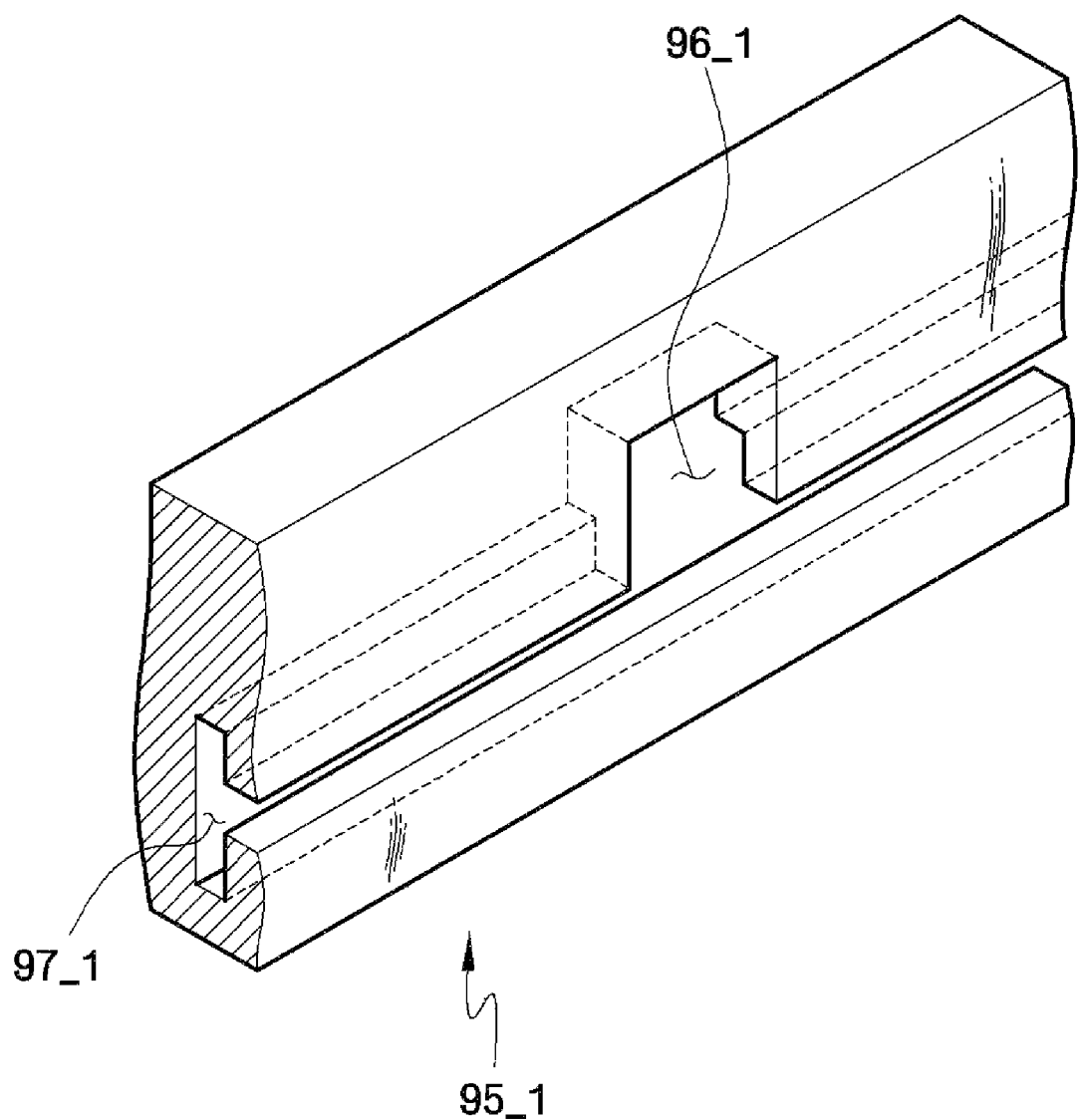
FIG. 7 is a partial rear perspective view of a guide bar included in the exemplary embodiment of a display unit of FIG. 2B.

Hereinafter, with reference to FIGS. 2A to 7, an exemplary embodiment of the display unit 10 included in a first exemplary embodiment of a multi-display device 1 according to the present invention will be described in detail. Here, FIG. 2A is a front perspective view of an exemplary embodiment of a display unit 10 included in the first exemplary embodiment of a multi-display device 1 of FIG. 1A, and FIG. 2B is a rear perspective view of the exemplary embodiment of a display unit 10 of FIG. 2A. FIG. 3 is an exploded perspective view of the exemplary embodiment of a display unit 10 of FIG. 2A, and FIG. 4 is a partial side perspective view illustrating joining of exemplary embodiments of a display unit 10 to form the first exemplary embodiment of a multi-display device 1 of FIG. 1A. FIG. 5 is a partial rear perspective view of the exemplary embodiment of a display unit 10 of FIG. 2B, FIG. 6 is a cross-sectional view of the exemplary embodiment of a display unit 10 of FIG. 2B, taken along line VI-VI', and FIG. 7 is a partial rear perspective view of a guide bar included in the exemplary embodiment of a display unit of FIG. 2B.

In the present exemplary embodiment, a display unit 10 is one of several units constituting a multi-display device 1, and a plurality of display units 10 are connected to one another through guide bars 95_1 and 95_2 to form the multi-display device 1 having a large-scale screen. In the present exemplary embodiment, the display unit 10 includes a display panel assembly 30, an upper receptacle 40, and a backlight assembly 20.

The display panel assembly 30 includes a display panel 31 having a thin film transistor ("TFT") substrate 32, a common electrode substrate 33, and a liquid crystal layer (not illustrated) interposed between the two substrates; a data chip film package 34; a gate chip film package 35; and an integrated printed circuit board 36. Alternative exemplary embodiments may include configurations wherein the data chip film package 34, the gate chip film package 35 and the integrated printed circuit board 36 are integrated into a single circuit board or chip film package.

In the present exemplary embodiment, the display panel 31 includes the TFT substrate 32 may include a plurality of gate lines (not illustrated), a plurality of data lines (not illustrated), a TFT array (not illustrated), and pixel electrodes; and the common electrode substrate 33 composed of black matrices and common electrodes, and arranged to face the TFT substrate 32. The display panel 31 as described above is configured to display image information.

In addition, the gate chip film package 35 is connected to the respective gate lines (not illustrated) formed on the lower substrate 32, and the data chip film package 34 is connected to the respective data lines (not illustrated) formed on the lower substrate 32. In the present exemplary embodiment, the gate chip film package 35 and the data chip film package 34 include a wiring pattern in which a semiconductor chip is formed on a base film, and a tape automated bonding ("TAB") tape bonded by a TAB technology. Exemplary embodiments of the chip film package include a tape carrier package ("TCP"), a chip on film ("COF"), and other similar components as would be known to one of ordinary skill in the art. However, the above-described chip film package is merely exemplary.

On the other hand, various driving elements for inputting gate drive signals to the gate chip film package 35 and for inputting data drive signals to the data chip film package 34 are packaged on the printed circuit board 36.

The upper receptacle 40 forms an outer casing of the display unit 10, and provides a space formed therein to receive the display panel assembly 30. A window for exposing the display panel 31 to an outside is formed in the center of the upper receptacle 40. In the present exemplary embodiment, the window is open so that the display panel assembly 30 is exposed through the upper receptacle 40.

The upper receptacle 40 is composed of first to fourth sidewalls 40_1, 40_2, 40_3, and 40_4, and joining projections 41 or joining grooves 42 are formed on the respective sidewalls 40_1, 40_2, 40_3, and 40_4. Although not shown in the illustrated exemplary embodiment, alternative exemplary embodiments include configurations wherein the first to fourth sidewalls 40_1-40_4 may include a combination of joining projections 41 and joining grooves 42. The first sidewall 40_1 and the fourth sidewall 40_4 have the joining projections 41 formed thereon, and the second sidewall 40_2 and the third sidewall 40_3 have the joining grooves 42 formed thereon. The joining projection 41 and the joining groove 42 have corresponding sizes and shapes so that they can be joined to each other.

In the present exemplary embodiment, the joining projection 41 is formed to project from an outer surface of the first sidewall 40_1 or the fourth sidewall 40_4. The size and shape of the joining projection 41 may be any of several well-known configurations. However, in one exemplary embodiment the joining projection 41 is formed to extend in a direction substantially perpendicular to the display panel 31, and one end part of the joining projection 41 is in contact with a bottom surface of the lower receptacle 90 in order to easily join the joining projection 41 of a first display unit 10 and the joining groove 42 of an additional display unit 10. Conversely, the joining groove 42 is concavely formed on an outer surface of the second sidewall 40_2 or the third sidewall 40_3. The joining groove 42, which fixedly receive the long joining projection 41, is formed in a direction substantially perpendicular to the display panel 31, and one end thereof has an aperture exposing the lower receptacle 90. Alternative exemplary embodiments include configurations wherein the joining projections 41 and joining grooves 42 may be disposed on different sidewalls as would be apparent to one of ordinary skill in the art.

The upper receptacle 40 includes a bezel part 43 which extends to an inner side of the sidewall 40_1, 40_2, 40_3, or 40_4 and surrounds the open window exposing the display panel 31. In one exemplary embodiment, the height t1 of the joining projection 41 is from about ⅔ of the width t2 of the bezel part 43 to about equal in height to the width t2 of the bezel part 43.

The upper receptacle 40 may be formed by a plating method, e.g., electroplating. In such an exemplary embodiment, the joining projection 41 may project to an outside of the first sidewall 40_1 or the fourth sidewall 40_4 through an embossing process, and the joining groove 42 may be concavely formed through a punching process or an embossing process. However, the material and the method of manufacturing the upper receptacle 40 are not limited thereto, and may be diversely formed by any of several methods well known in the art, e.g., molding and other similar methods.

Referring to FIG. 4, the second sidewall 40_2 of the display unit 10 is joined to the fourth sidewall 40_4 of an adjacent display unit 10. As described above, the second sidewall 40_2 includes the joining groove 42, and the fourth sidewall 40_4 includes the joining projection 41, so that the second sidewall 40_2 and the fourth sidewall 40_4 of the adjacent display may be joined together in coincidence with each other. Correspondingly, the first sidewall 40_1 may be joined to the third sidewall 40_3 of another adjacent display unit 10.

In one exemplary embodiment, the second sidewall 40_2 and the fourth sidewall 40_4 of an adjacent display may be joined together through their movement in a direction substantially parallel to each other. However, in another exemplary embodiment the second sidewall 40_2 may be inserted in a direction substantially perpendicular to the front surface of the fourth sidewall 40_4, or the fourth sidewall 40_4 may be inserted in a direction substantially perpendicular to the rear surface of the second sidewall 40_2, thereby allowing the joining projection 41 to smoothly be inserted along the length of the joining groove 42.

Referring again to FIG. 3, the upper receptacle 40 is engaged with the lower receptacle 90 via a middle frame 50. In one exemplary embodiment, the backlight assembly 20 includes the middle frame 50, optical sheets 60, a diffusion plate 70, and a light assembly 80, in addition to the lower receptacle 90.

The middle frame 50 receives the optical sheets 60, the diffusion plate 70, and the light assembly 80 therein, and may be securely fixed to the lower receptacle 90. The middle frame 50 is provided with sidewalls formed along tetragonal edges thereof, and an open window for transmitting light having passed through the diffusion plate 70 and the optical sheets 60 is formed in the center thereof.

The optical sheets 60, which serve to diffuse and condense light being transferred from the diffusion plate 70, are arranged on the upper part of the diffusion plate 70, and are received in the middle frame 50. In one exemplary embodiment, the optical sheets 60 include a first prism sheet, a second prism sheet, and a protection sheet. Alternative exemplary embodiments include configurations wherein one or more optical sheets 60 may be omitted. In the exemplary embodiments where they are included, the first and second prism sheets serve to improve the brightness of the display device in an effective viewing angle range by concentrating light incident at low angles upon the front through refraction of the light having passed through the diffusion plate 50. In the exemplary embodiments where it is included, the protection sheet formed on the first and second prism sheets not only protect the surface of the prism sheets but also diffuses light in order to make the light distribution more uniform. The construction of the optical sheets 60 is not limited to that as described above, but can be diversely modified in accordance with the specifications of the display unit 10.

The diffusion plate 70 serves to diffuse light from the light source so that brightness defects, which can appear as a bright portion corresponding to the shape of a light unit 81, is not shown through the display unit 10. In essence, the diffusion plate 70 scatters the light coming from the light unit 81 so that the light reaching the display panel 31 has a more uniform distribution.

The light assembly 80 is a light emitting device supplying the light to the diffusion plate 70, and includes the light unit 81 and a circuit board 82. In the exemplary embodiment shown in FIG. 3, the light unit 81 includes a plurality of point light sources. In one exemplary embodiment, the point light sources may include a plurality of light emitting diodes ("LEDs"). In such an exemplary embodiment, the plurality of LEDs may include red, green, blue LEDs. In an alternative exemplary embodiment, the plurality of LEDs may include white LEDs in addition to, or as an alternative to, the colored LEDs. In one exemplary embodiment, the light unit 81 may include the minimum number of point light sources required for generating light having a white color, e.g., a particular combination of red, green, blue LEDs. The light unit 81 is connected to the circuit board 82 to receive a driving voltage for operation of the plurality of point light sources. The exemplary embodiment of the light unit 81 shown in FIG. 3 is fixedly arranged on the upper part of the circuit board 82.

A reflective sheet 85 may be provided on the circuit board 82. The reflective sheet 85 includes apertures through which the light unit 81 is exposed, and serves to increase the light emitting efficiency of the backlight assembly 20 by reflecting the light emitting downward to the display panel 31 towards the outside.

Referring to FIG. 5, on the rear part of the display unit 10, e.g., on a rear surface of the lower receptacle 90, a first hook projection 91_1 and a second hook projection 91_2 are formed. The first hook projection 91_1 and the second hook projection 91_2 are joined to the first guide bar 95_1 and the second guide bar 95_2, respectively, to connect between the display unit 10 and an adjacent display unit 10.

The first hook projection 91_1 is located on the rear surface of the lower receptacle 90, and serves to join adjacent display units 10 in a horizontal direction. The first hook projection 91_1 includes a support part and an extension part to form a "T"-shape in cross section, and joins the display units 10 as it moves within a first guide rail 97_1 through a first hook groove 96_1 of the first guide bar 95_1. The first hook projection 91_1 may be formed integrally as a solitary, indivisible unit with the lower receptacle 90, or may be formed separately from the lower receptacle 90 and subsequently joined thereto.

Referring to FIGS. 6 and 7, the first guide bar 95_1 includes the first guide rail 97_1 having a groove with a "T"-shaped cross section. The first guide rail 97_1 is configured to be engaged with the first hook projection 91_1, and the display units 10 may be aligned along the first guide bar 95_1 to form the flat large-screen multi-display device 1. That is, the first guide bar 95_1 serves as an alignment bar aligning and connecting the display units 10. The display units 10 may similarly be aligned in accordance with the shape of the second guide bar 95_2, as shown in FIG. 5, and the length of the first and second guide bars 95_1 and 95_2 may be adjusted as needed.

Referring to FIG. 1B, the first and second guide bars 95_1 and 95_2 may further include fixing members 98 to fix the first guide bars 95_1 and 95_2 to the display units 10, respectively. The fixing members 98 may fix the display units in diverse methods as would be apparent to one of ordinary skill in the art, one exemplary embodiment of which includes a screw-engaging method. Exemplary embodiments of the multi-display device 1 are not limited in joining direction of the display units 10 and number of joined units. Exemplary embodiments may include configurations wherein a plurality of display units 10 are stacked in a vertical column, but are not adjacent in a horizontal direction. In such an exemplary embodiment, the first hook projection 91_1 and the first guide bar 95_1 may be omitted. Similarly, in a display 1 wherein the display units 10 are arranged in a horizontal row, but are not adjacent in a vertical direction, the second hook projection 91_2 and the second guide bar 95_2 may be omitted.

Figure 8A:
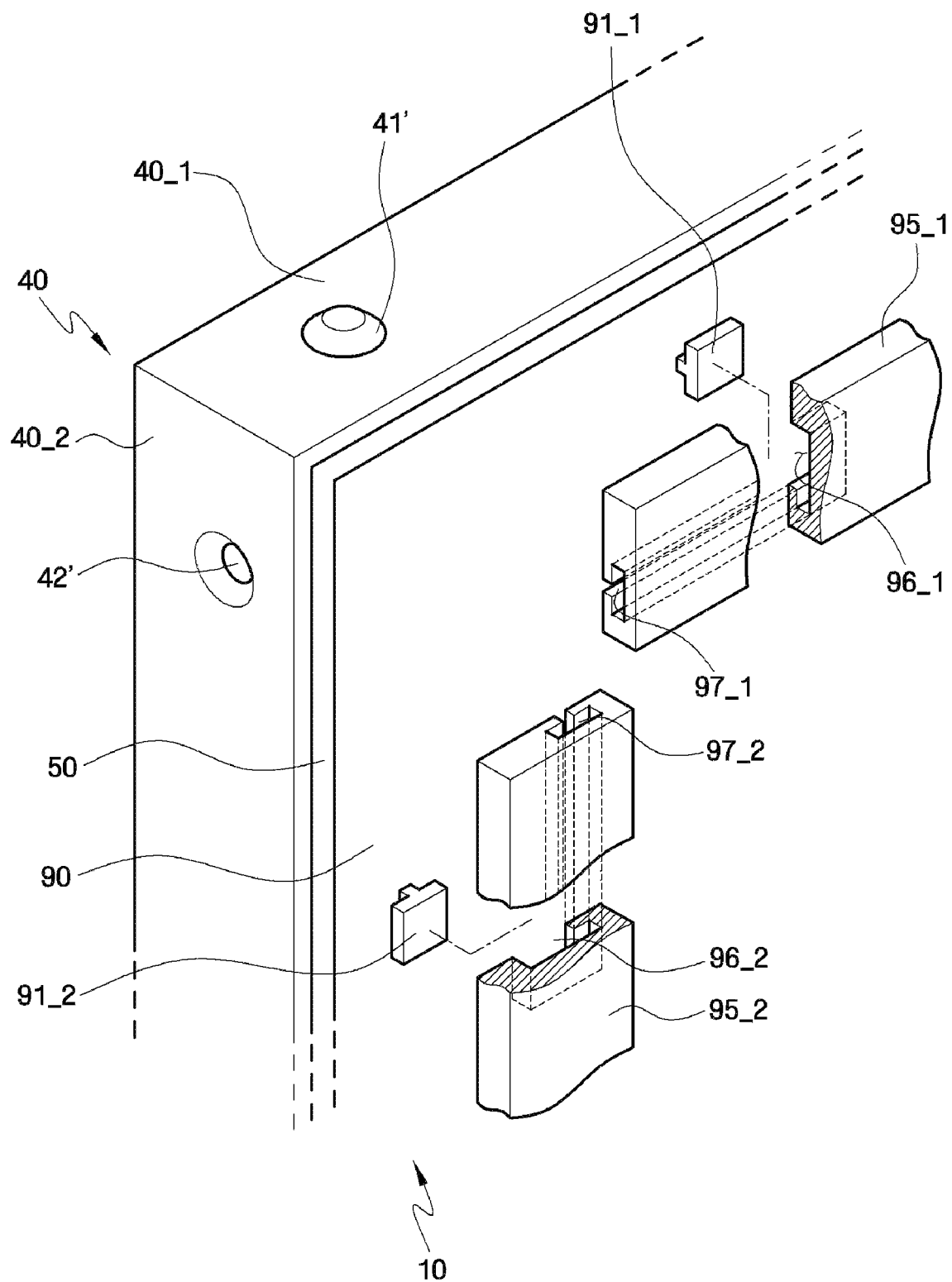
FIG. 8A is a partial rear perspective view illustrating an alternative exemplary embodiment of a display unit.
Figure 8B:
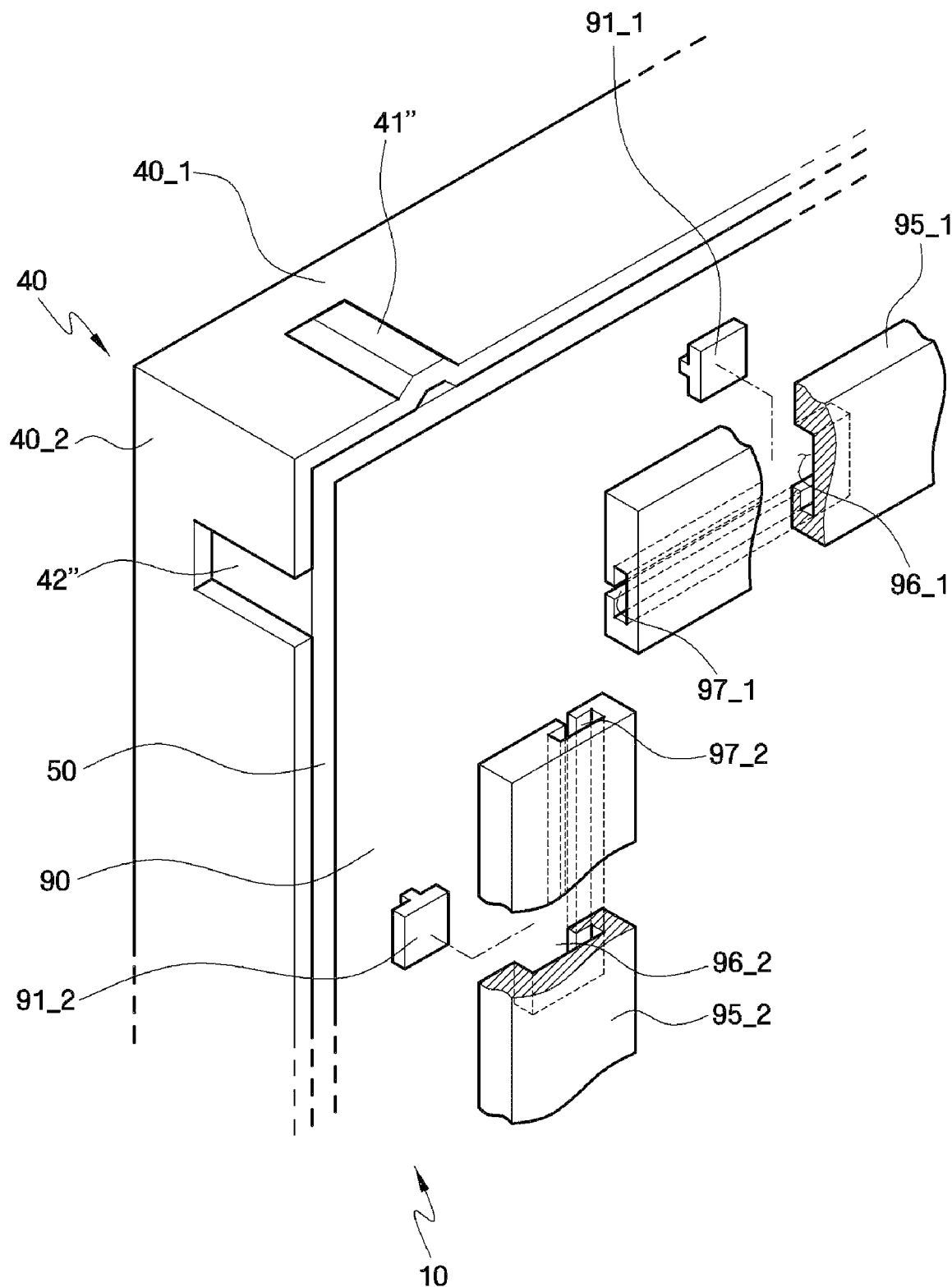
FIG. 8B is a partial rear perspective view illustrating another alternative exemplary embodiment of a display unit.

Hereinafter, with reference to FIGS. 8A and 8B, alternative exemplary embodiments of the display unit according to the present invention will be described in detail. Here, FIG. 8A is a partial rear perspective view illustrating an alternative exemplary embodiment of a display unit 10, similar to that shown in FIG. 5, and FIG. 8B is a partial rear perspective view illustrating another alternative exemplary embodiment of a display unit 10, similar to that shown in FIG. 5. For convenience of description and explanation, the same reference numerals are used for like elements having the same functions as those of the elements in the first exemplary embodiment of the present invention across various figures, and the description thereof will be omitted.

First, referring to FIG. 8A, the alternative exemplary embodiment of a display unit 10 includes a joining projection 41' having a circular horizontal cross section.

In one exemplary embodiment, the joining projection 41' is formed to project from the outer surface of the first sidewall 40_1 or the fourth sidewall 40_4, and the joining groove 42' is concavely formed on the outer surface of the second sidewall 40_2 or the third sidewall 40_3. The joining projection 41' is formed to extend from the edge of the first sidewall 40_1 and the fourth sidewall 40_4 for a specified distance, and to have a circular cross section. The joining groove 42' may be formed in a region substantially opposite to, and corresponding to, the joining projection 41' of the second sidewall 40_2 or the third sidewall 40_3. The joining groove 42' may be in the form of a circle depression having a shape corresponding to the joining projection 41'. In one exemplary embodiment the height t1 of the joining projection 41 is from about ⅔ of the width t2 of the bezel part 43 to about equal in height to the width t2 of the bezel part 43. As mentioned above, alternative exemplary embodiments include configurations wherein the joining projection 41' and joining groove 42' may be located in different locations on the display unit 10.

Next, with reference to FIG. 8B, another exemplary embodiment of a display unit 10 according to the present invention includes a joining projection 41" having a tetragon-shaped vertical cross section.

The joining projection 41" is formed to project from an outer surface of the first sidewall 40_1 or the fourth sidewall 40_4. The joining projection 41" may have a wide range of sizes and shapes as would be apparent to one of ordinary skill in the art. However, in consideration of easy joining between the joining projection 41" and the joining groove 42", the joining projection 41" may be formed to extend in a direction substantially perpendicular to the display panel 31, and one end part of the joining projection 41" may be in contact with the bottom surface of the lower receptacle 90. The joining projection 41" may have a tetragon-shaped vertical cross section.

The joining groove 42" may be concavely formed on the outer surface of the second sidewall 40_2 or the third sidewall 40_3. The joining groove 42", which fixedly receives the joining projection 41", is formed in a direction substantially perpendicular to the display panel 31 in substantially the same manner as the joining projection 41", and one end thereof has an aperture exposing the lower receptacle 90 therethrough. In one exemplary embodiment, the joining groove 42" may have a tetragon-shaped vertical cross section so as to fixedly receive the joining projection 41".

The upper receptacle 40 includes a bezel part 43 which extends to an inner side of the sidewall 40_1, 40_2, 40_3, or 40_4 and surrounds the open window. Similar to the previous exemplary embodiments, the height t1 of the joining projection 41" may be from about ⅔ the width t2 of the bezel part 43 to about equal in height to the width t2 of the bezel part 43.

Figure 9:
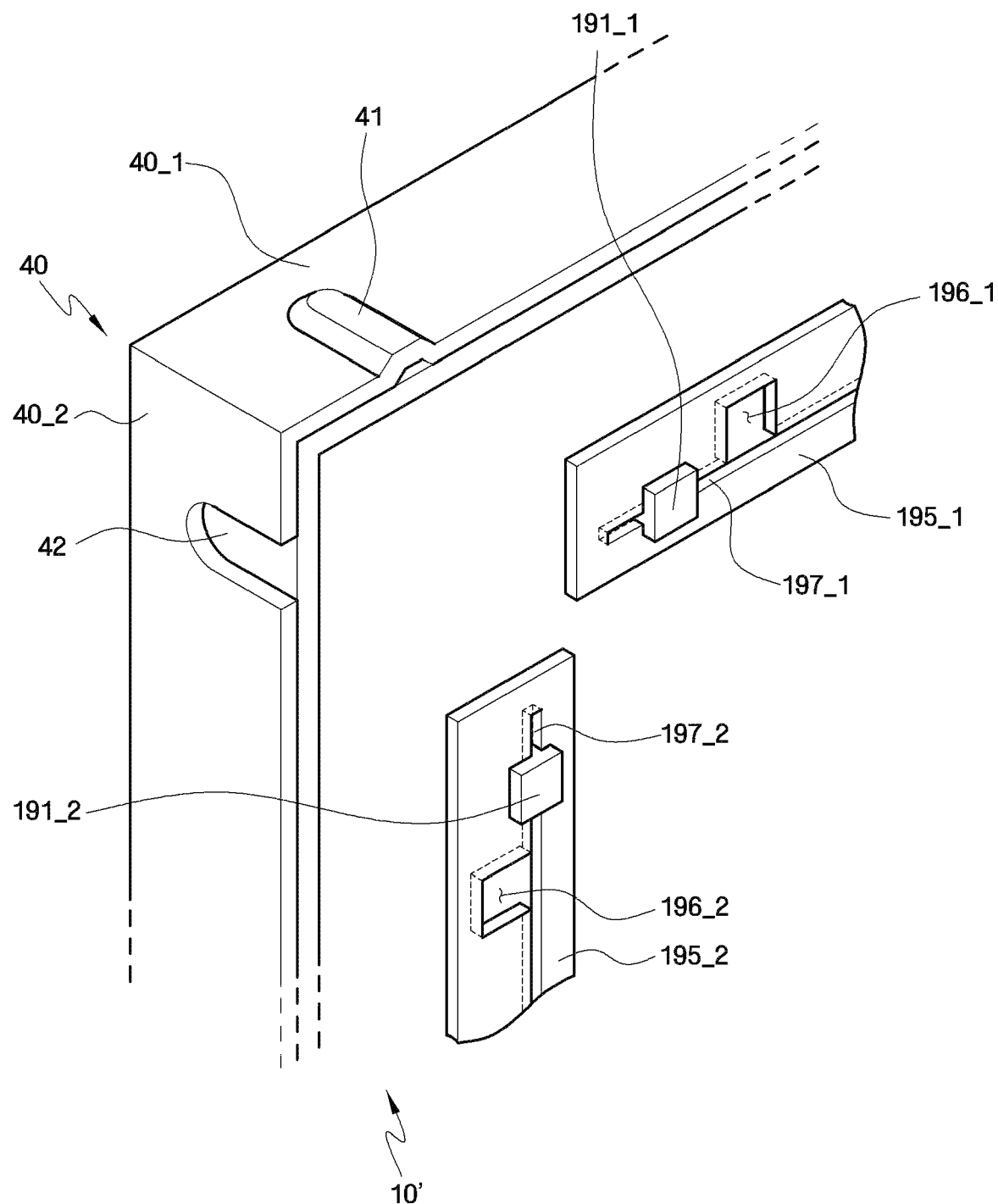
FIG. 9 is a partial rear perspective view of an exemplary embodiment of a display unit included in a second exemplary embodiment of a multi-display device according to the present invention.
Figure 10:
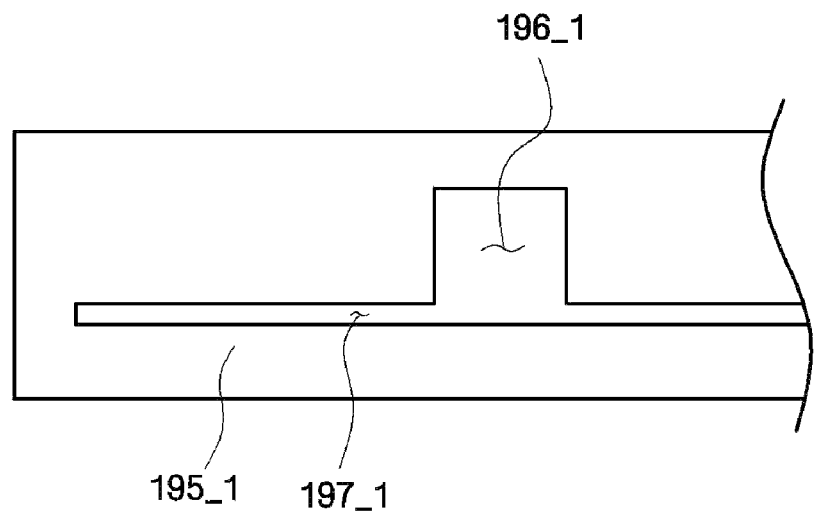
FIG. 10 is a top plan view of an exemplary embodiment of a guide bar included in the exemplary embodiment of a display unit of FIG. 9.

Hereinafter, a second exemplary embodiment of a display unit according to the present invention will be described in detail with reference to FIGS. 9 and 10. Here, FIG. 9 is a partial rear perspective view of a rear part of second exemplary embodiment of a display unit 10' included in a second exemplary embodiment of a multi-display device according to the present invention, and FIG. 10 is a top plan view of a guide bar included in the exemplary embodiment of a display unit 10' of FIG. 9. For convenience in explanation, like reference numerals are used for the elements having the same functions as those of the elements in the first exemplary embodiment of the present invention across various figures, and repetitive description thereof will be omitted.

The exemplary embodiment of a display unit 10' according to the second exemplary embodiment of the present invention includes a first hook projection 191_1 and a second hook projection 191_2 formed on the rear surface of the lower receptacle 90. The first hook projection 191_1 is engaged with a first guide bar 195_1 to fix the display unit 10' and an adjacent display unit 10' in a horizontal direction, and the second hook projection 191_2 is engaged with a second guide bar 195_2 to fix the display unit 10' and an adjacent display unit 10' in a vertical direction. The first guide bar 195_1 and the second guide bar 195_2 may be formed with a relatively small thickness so that the first hook projection 191_1 and the second hook projection 101_2 can project therethrough as shown in FIG. 9.

The first guide bar 195_1 includes a first hook groove 196_1 and a first guide rail 197_1. The first hook groove 196_1 is in the form of an aperture formed through the first guide bar 195_1 so that the first hook projection 191_1 can be inserted into the first hook groove 196_1. The first guide rail 197_1 is formed to extend from the first hook groove 196_1 so that the first hook projection 191_1 slides along the first guide rail 197_1 while fixedly connecting the display unit 10' to the first guide bar 195_1. The thickness of the multi-display device 1' composed of individual display units 10' may be reduced from the previously described exemplary embodiment because the first hook projection 191_1 is penetratingly engaged with the first guide bar 195_1 and slides along the first guide rail 197_1, thereby eliminating a thickness extending beyond the first and second hook projections 191_1 and 191_2.

Similarly, the second guide bar 195_2 includes a second hook groove 196_2 and a second guide rail 197_2. The second hook groove 196_2 is in the form of an aperture formed through the second guide bar 195_2 so that the second hook projection 191_2 can be inserted into the second hook groove 196_2. The second guide rail 197_2 is formed to extend from the second hook groove 196_1 so that the second hook projection 191_2 slides along the second guide rail 197_2 while fixedly connecting the display unit 10' to the second guide bar 195_2.

In the present exemplary embodiment, the first hook projection 191_1 and the first guide bar 195_1 have substantially the same configuration as the second hook projection 101_2 and the second guide bar 195_2 except that their fixing directions are different from each other, e.g., the first hook projection 191_1 and the first guide bar 195_1 fix adjacent displays in a horizontal direction and the second hook projection 191_1 and the second guide bar 195_2 fix adjacent displays in a vertical direction.

Figure 11:
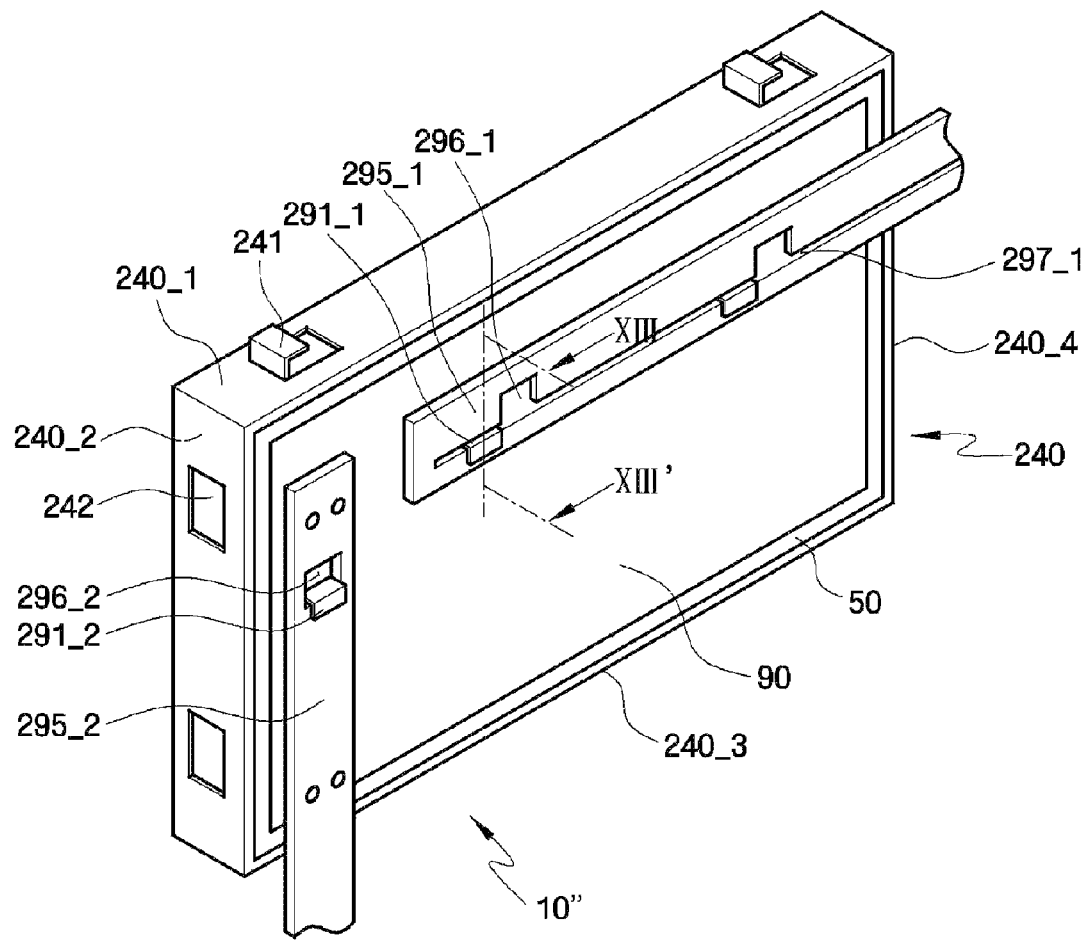
FIG. 11 is a rear perspective view of an exemplary embodiment of a display unit included in a third exemplary embodiment of a multi-display device according to the present invention.
Figure 12:
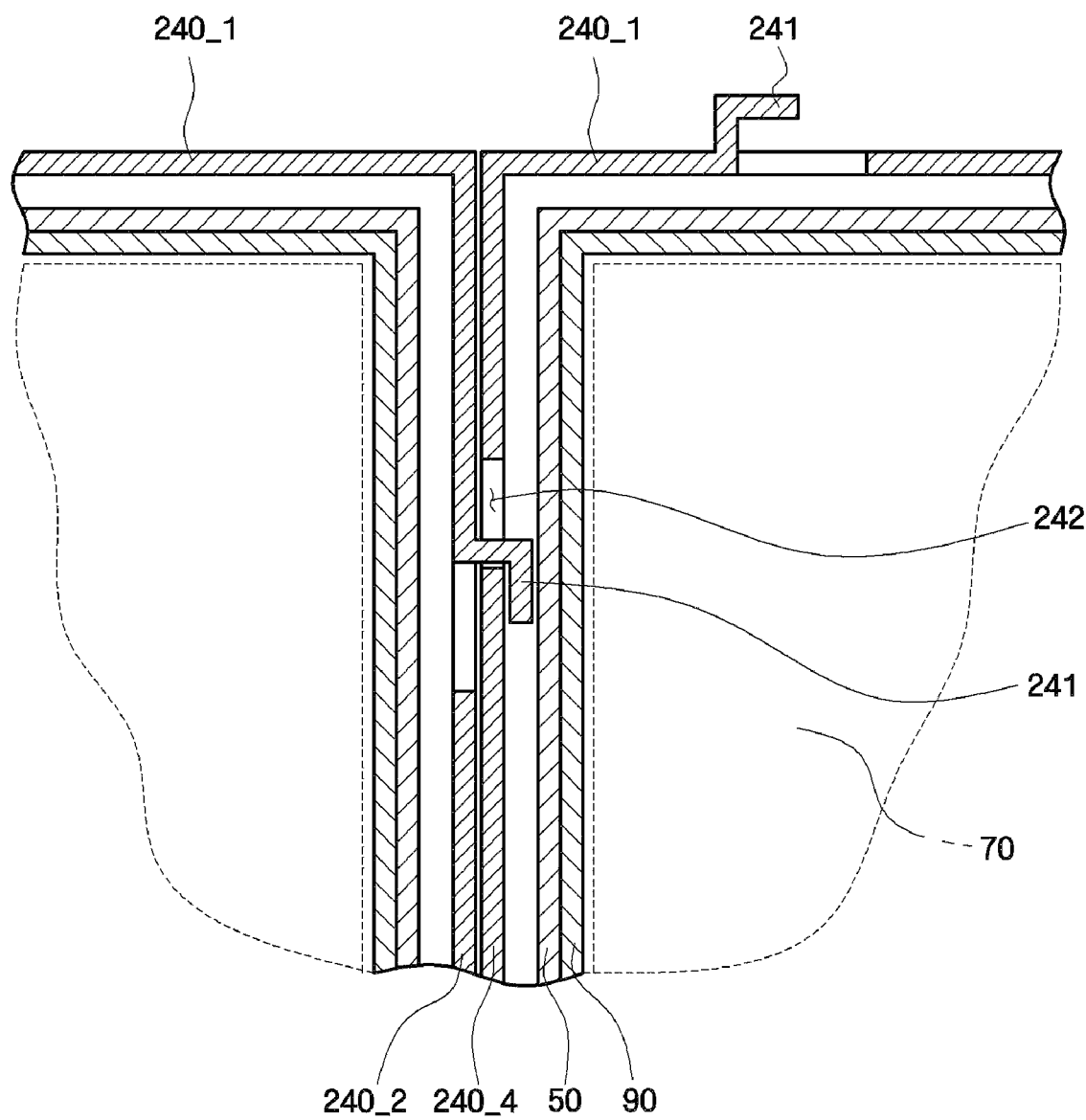
FIG. 12 is a partial cross-sectional view illustrating joining of exemplary embodiments of the display units of FIG. 1.
Figure 13:
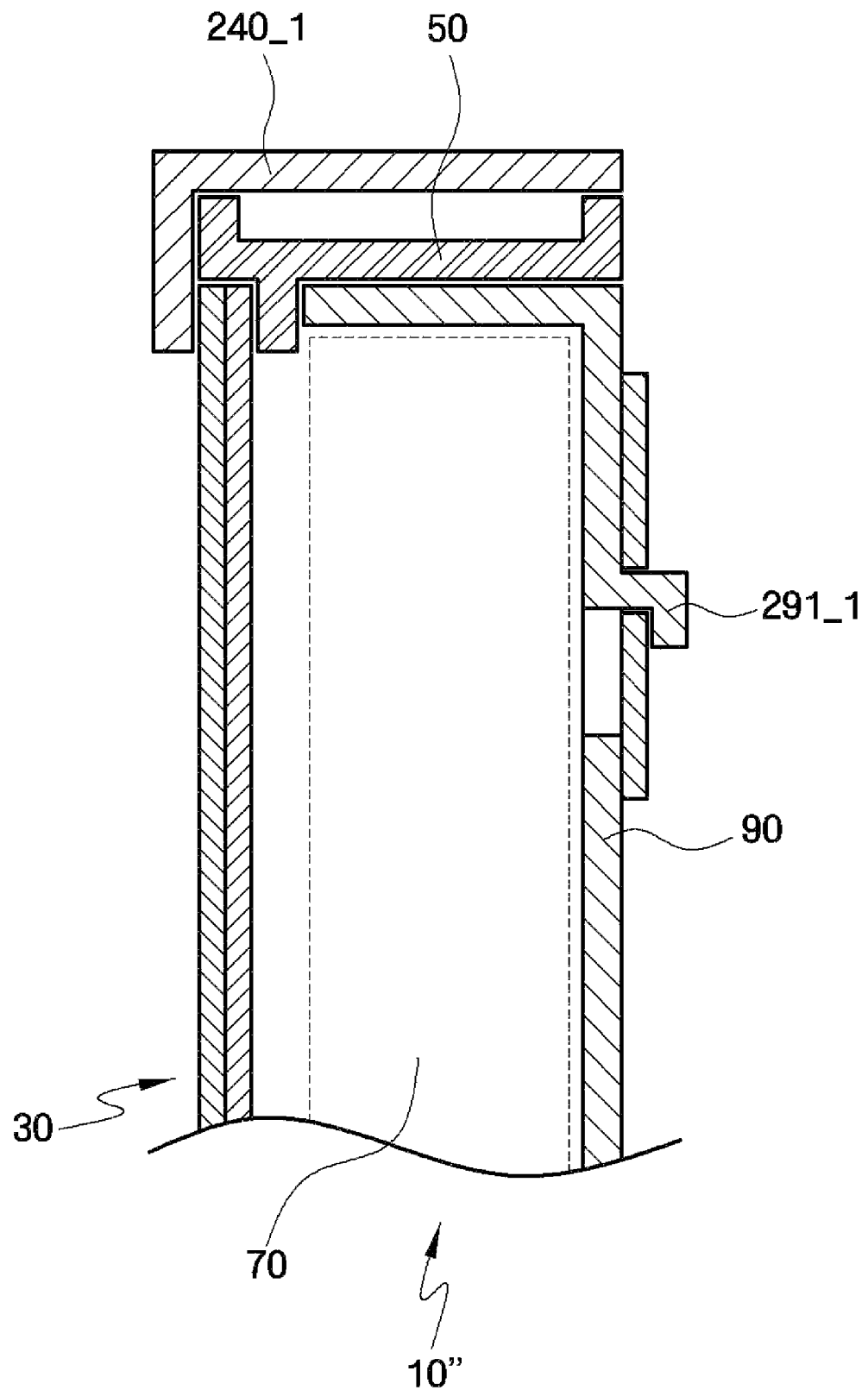
FIG. 13 is a cross-sectional view of the exemplary embodiment of a display unit of FIG. 11, taken along line XIII-XIII'.

Hereinafter, a third exemplary embodiment of the display unit according to the present invention will be described in detail with reference to FIGS. 11 and 13. Here, FIG. 11 is a rear perspective view of an exemplary embodiment of a display unit 10" included in a third exemplary embodiment of a multi-display device according to the present invention, FIG. 12 is a partial cross-sectional view illustrating joining of the display units 10" of FIG. 11, and FIG. 13 is a cross-sectional view of the exemplary embodiment of a display unit 10" of FIG. 11, taken along line XIII-XIII'. For convenience in explanation, like reference numerals are used for the elements having the same functions as those of the elements in the first and second exemplary embodiment of the present invention across various figures, and the repetitive description thereof will be omitted.

The third exemplary embodiment of a display unit 10" according to the present invention includes joining projections 241 and joining grooves 242 formed on the upper receptacle 240, and a first hook projection 291_1 and second hook projections 291_2 formed on the lower receptacle 90.

The upper receptacle 240 includes first to fourth sidewalls 240_1, 240_2, 240_3, and 240_4, and the joining projections 241 or the joining grooves 242 are formed on the first to fourth sidewalls 240_1, 240_2, 240_3, and 240_4. In one exemplary embodiment, the upper receptacle 240 may be a metal plate, and the joining projections 241 and the joining grooves 242 may be formed through a machining process. In the present exemplary embodiment, the joining projections 241 are formed on the first sidewall 240_1 and the fourth sidewall 240_4 of the upper receptacle 240, and the joining grooves 242 are formed on the second sidewall 240_2 and the third sidewall 240_3 of the upper receptacle 240. In one exemplary embodiment, the joining projection 241 may be formed by bending a part of the sidewall of the upper receptacle 240, and the joining groove 242 may be formed by removing a part of the sidewall of the upper receptacle 240 to form an aperture. As mentioned above, alternative exemplary embodiments include configurations wherein the joining projection 241 and joining groove 242 may be located in different locations on the display unit 10".

Referring to FIG. 12, the display unit 10" and an adjacent unit 10" can be joined together by the joining projections 241 and the joining grooves 242. The second sidewall 240_2 and the fourth sidewall 240_4 of the adjacent display unit 10" come in contact with each other when the display unit 10" and the adjacent display unit 10" are joined together. At this time, the joining projections included in the second sidewall 240_2 are joined to the joining grooves 242 included in the fourth sidewall 240_4.

Referring to FIGS. 11 and 13, in the present exemplary embodiment the first hook projections 291_1 and the second hook projection 291_2 are formed from the lower receptacle 90. In one exemplary embodiment, the lower receptacle 90 may be a metal plate, and the first hook projections 291_1 and the second hook projection 291_2 may be formed by cutting parts of the bottom surface of the lower receptacle 90. The first hook projection 291_1 may be engaged with the first guide bar 295_1 to fix the multi-display device 1 in a horizontal direction, and the second hook projection 291_2 may be engaged with the second guide bar 295_2 to fix the multi-display device 1 in a vertical direction.

The first guide bar 295_1 includes a first hook groove 296_1 and a first guide rail 297_1. The first hook groove 296_1 is formed through the first guide bar 295_1, and the first guide rail 297_1 is formed to extend in a horizontal direction from the first hook groove 296_1. The first hook projection 291_1 is inserted through the first hook groove 296_1 of the first guide bar 295_1, slides along the first guide rail 297_1, and joins the first guide bar 295_1 to the display unit 10".

The second guide bar 295_2 includes a second hook groove 296_2. The second hook groove 296_2 is formed through the second guide bar 295_2, and the second hook projection 291_2 is inserted into and engaged with the second hook groove 296_2.

As described above, exemplary embodiments of the display unit having the structure in which the upper receptacle and the lower receptacle are engaged with each other according to the first to third exemplary embodiments of the present invention have been described. However, the structure in which the upper receptacle and the lower receptacle are engaged with each other as described above is mere exemplary, and the above-described joining projections and the joining grooves may be formed on the lower receptacle or a middle frame instead of the upper receptacle.

Figure 14:
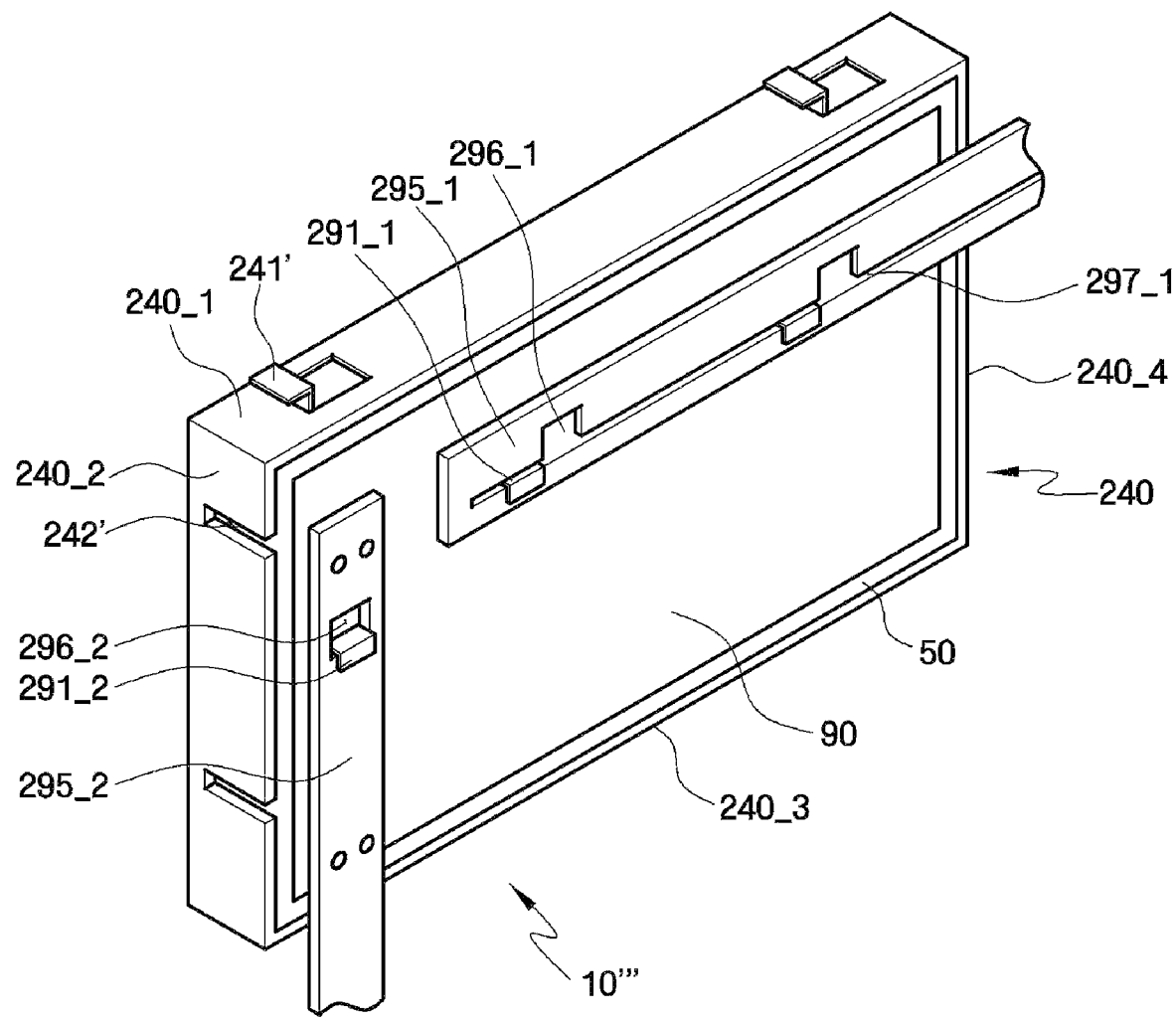
FIG. 14 is a rear perspective view of an exemplary embodiment of a display unit included in a fourth exemplary embodiment of a multi-display device according to the present invention.
Figure 15:
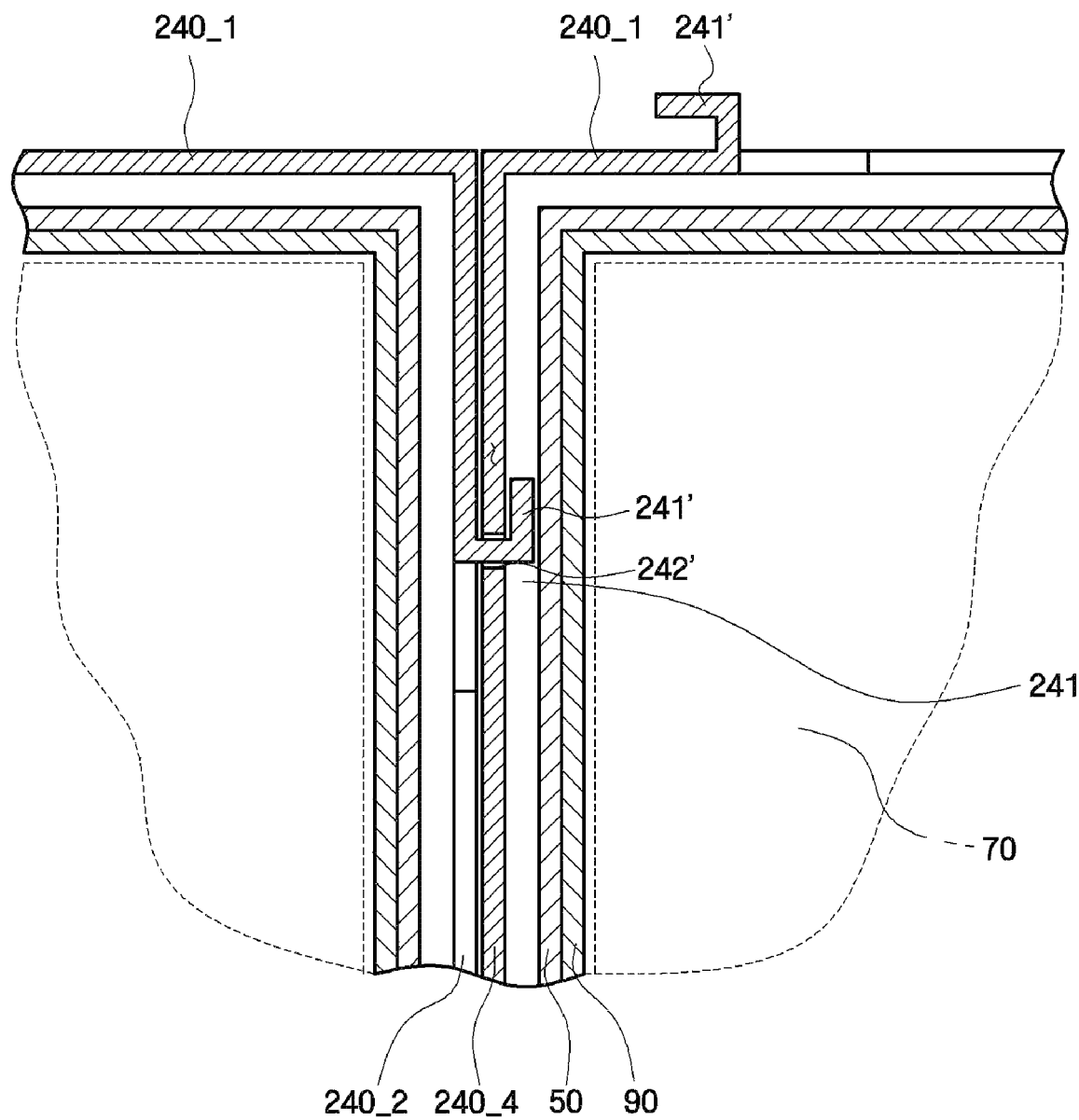
FIG. 15 is a partial cross-sectional view illustrating joining of exemplary embodiments of the display units of FIG. 13.

Hereinafter, a fourth exemplary embodiment of the display unit according to the present invention will be described in detail with reference to FIGS. 14 and 15. Here, FIG. 14 is a rear perspective view of an exemplary embodiment of a display unit 10''' included in a fourth exemplary embodiment of a multi-display device according to the present invention, and FIG. 15 is a partial cross-sectional view illustrating joining of exemplary embodiments of the display units of FIG. 13. For convenience in explanation, similar reference numerals are used for the elements having the same functions as those of the elements in the first embodiment of the present invention across various figures, and the repetitious description thereof will be omitted.

In the display unit according to the fourth embodiment of the present invention, joining grooves 242' having narrow width are formed on the second sidewall 240_2 and the third sidewall 240_3 of the upper receptacle 240. As the display unit 10''' is moved in a direction perpendicular to the panel surface, a joining projection 241' may be inserted into the joining groove 242' to be joined to each other.

The upper receptacle 240 includes first to fourth sidewalls 240_1, 240_2, 240_3, and 240_4, and the joining projections 241' or the joining grooves 242' are formed on the first to fourth sidewalls 240_1, 240_2, 240_3, and 240_4. In one exemplary embodiment, the upper receptacle 240 may be a metal plate, and the joining projections 241' and the joining grooves 242' may be formed through a machining process. In the present exemplary embodiment, the joining projections 241' are formed on the first sidewall 240_1 and the fourth sidewall 240_4 of the upper receptacle 240, and the joining grooves 242' are formed on the second sidewall 240_2 and the third sidewall 240_3 of the upper receptacle 240. In one exemplary embodiment, the joining projection 241' may be formed by bending a part of the sidewall of the upper receptacle 240, and the joining groove 242' may be formed by cutting a part of the sidewall of the upper receptacle 240 to form an aperture. In such an exemplary embodiment, the joining groove 242' may be formed in a manner such that one side of the second sidewall 240_2 or the third sidewall 240_3 of the upper receptacle 240 is completely opened, e.g., it may form a slot-shape. As mentioned above, alternative exemplary embodiments include configurations wherein the joining projection 241' and joining groove 242' may be located in different locations on the display unit 10'''.

It would be apparent to one of ordinary skill in the art that the number of hook projections, joining projections, joining grooves, guide bars and fixing members may be adjusted to fit individual design characteristics of the display units and combined display device.

As described above, the display unit and the multi-display device having the same according to the embodiments of the present invention have the following effects. First, the uniform flatness of the multi-display device can be maintained irrespective of the number of display units being joined together. Second, the display units can be firmly joined together as the size of a non-display region of the multi-display device is maintained. Third, the display units can be easily attached to and detached from one another to heighten the work efficiency.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A display unit comprising:
   a display panel; and
   a receptacle including a plurality of sidewalls configured to receive the display panel, the receptacle including at least one joining projection disposed on at least one of the sidewalls, and at least one joining groove formed on at least one of the sidewalls;
   wherein the at least one joining projection and the at least one joining groove are disposed on opposing sidewalls of the receptacle in substantially symmetrical positions with respect to a center line of the receptacle.

2. The display unit of claim 1, wherein the receptacle comprises:
   an upper receptacle positioned on an upper part of the display panel and having an open window which exposes the display panel therethrough; and
   a lower receptacle positioned on a lower part of the display panel and joined to the upper receptacle; and
   wherein the upper receptacle comprises sidewalls surrounding the open window, and the at least one joining projection and the at least one joining groove are respectively disposed on the sidewalls of the upper receptacle.

3. The display unit of claim 2, wherein the upper receptacle further comprises a bezel part extending to an inside of the sidewalls surrounding the open window, and a height of the at least one joining projection is from about ⅔ of a width of the bezel part to about equal in height to the width of the bezel part.

4. The display unit of claim 1, wherein the at least one joining projection includes a circular, elliptical, triangular or tetragonal cross-section.

5. The display unit of claim 1, wherein the at least one joining projection has a first end part in contact with a bottom surface of the receptacle, and extends in a direction substantially perpendicular to a plane defined by the display panel; and
   wherein the at least one joining groove includes an aperture in a sidewall of the receptacle configured for joining with the joining projection.

6. The display unit of claim 1, wherein the receptacle further comprises at least one hook projection disposed on a rear surface of the receptacle.

7. The display unit of claim 6, wherein the receptacle comprises:
   an upper receptacle positioned on an upper part of the display panel and having an open window which exposes the display panel therethrough; and
   a lower receptacle positioned on a lower part of the display panel and joined to the upper receptacle; and
   wherein the at least one hook projection is disposed on the lower receptacle.

8. The display unit of claim 6, wherein the at least one hook projection comprises:
   a support part joined to the receptacle; and
   an extension part extending in a direction substantially perpendicular to the support part.

9. The display unit of claim 6, wherein the at least one hook projection is separate and divisible from the receptacle.

10. The display unit of claim 6, wherein the at least one hook projection is a bent extension of the receptacle.

11. The display unit of claim 1, wherein the at least one joining projection is a bent extension of the receptacle and the at least one joining groove is an aperture in the receptacle.

12. A multi-display device comprising:
    a plurality of display panels; and
    a plurality of display units each having a receptacle including a plurality of sidewalls configured to receive an individual display panel of the plurality of display panels, each of the plurality of receptacles including at least one joining projection disposed on at least one of the sidewalls, and at least one joining groove formed on at least one of the sidewalls;
    wherein the at least one joining projection and the at least one joining groove are disposed on opposing sidewalls of the receptacle in substantially symmetrical positions with respect to a center line of the receptacle.

13. The multi-display device of claim 12, wherein each of the plurality of receptacles comprises an upper receptacle positioned on an upper part of the display panel and having an open window which exposes the display panel therethrough; and
    a lower receptacle positioned on a lower part of the display panel and joined to the upper receptacle; and
    wherein the upper receptacle comprises sidewalls surrounding the open window, and the joining projection and the joining groove are respectively disposed on the sidewalls of the upper receptacle.

14. The multi-display device of claim 12, wherein the joining projection includes a circular, elliptical, triangular or tetragonal cross-section.

15. The multi-display device of claim 12, further comprising:
    at least one hook projection disposed on a rear surface of each of the plurality of receptacles; and
    at least one guide bar having at least one hook groove configured to be coupled with the at least one hook projection,
    wherein the joining projection and the joining groove are configured to join the plurality of display units together.

16. The multi-display device of claim 15, wherein the at least one guide bar further comprises a guide rail into which the at least one hook projection is movably inserted.

17. The multi-display device of claim 15, wherein the at least one hook groove is connected to the guide rail.

18. The multi-display device of claim 15, wherein the at least one hook projection comprises:
   a support part joined to the receptacle; and
   an extension part extending in a direction substantially perpendicular to the support part.

19. The multi-display device of claim 18, wherein the hook projection penetrates the guide bar and is exposed to an outside.

20. The multi-display device of claim 15, wherein the hook projection is a bent extension of the receptacle.

21. The multi-display device of claim 15, further comprising a fixing member fixing the guide bar to the receptacle.

22. The multi-display device of claim 12, wherein the joining projection has a first end part in contact with a bottom surface of the receptacle, and extends in a direction substantially perpendicular to a plane defined by the display panel; and
   wherein the joining groove includes an aperture in a sidewall of the receptacle configured for joining with the joining projection.

23. The multi-display device of claim 12, further comprising:
   a guide bar connecting the plurality of display units; and
   a fixing member connecting the plurality of display units to the guide bar.

24. The multi-display device of claim 12, wherein the joining projection and the joining groove are formed by bending the receptacle.

25. The multi-display device of claim 12, wherein the plurality of display units are connected in a matrix shape.

26. A method of manufacturing a multi-display device, the method comprising:
   providing a plurality of display units, each of the plurality of display units having a receptacle including a plurality of sidewalls configured to receive a display panel, each of the plurality of receptacles including at least one joining projection disposed on at least one of the sidewalls, and at least one joining groove formed on at least one of the sidewalls; and
   combining the plurality of display units by inserting the joining projection from a first display unit of the plurality of display units into the joining groove of an adjacent display unit of the plurality of display units,
   wherein the at least one joining projection and the at least one joining groove are disposed on opposing sidewalls of the receptacle in substantially symmetrical positions with respect to a center line of the receptacle.

* * * * *